(12) United States Patent
Chu

(10) Patent No.: US 7,208,786 B2
(45) Date of Patent: Apr. 24, 2007

(54) MEMORY DEVICE

(75) Inventor: Daping Chu, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 439 days.

(21) Appl. No.: 09/866,781

(22) Filed: May 30, 2001

(65) Prior Publication Data

US 2002/0006057 A1    Jan. 17, 2002

(30) Foreign Application Priority Data

May 31, 2000    (GB) ................................. 0013232.4

(51) Int. Cl.
*H01L 29/76* (2006.01)
*H01L 29/94* (2006.01)
*G11C 11/22* (2006.01)

(52) U.S. Cl. ............................... 257/295; 257/E21.208; 257/E21.664; 257/E27.104; 365/145

(58) Field of Classification Search ........ 257/295–311, 257/532; 438/3
See application file for complete search history.

(56) References Cited

U.S. PATENT DOCUMENTS

| | | | |
|---|---|---|---|
| 2,782,397 A | | 2/1957 | Young |
| 3,599,185 A | * | 8/1971 | Bartlett et al. .............. 365/145 |
| 3,683,211 A | * | 8/1972 | Perlman et al. .............. 310/326 |
| 3,740,582 A | * | 6/1973 | McCusker et al. .......... 327/456 |
| 3,754,214 A | * | 8/1973 | Matsumoto et al. ......... 235/382 |
| 4,868,447 A | | 9/1989 | Lee et al. |
| 5,060,191 A | * | 10/1991 | Nagasaki et al. ............. 365/145 |
| 5,485,053 A | | 1/1996 | Baz |
| 5,537,863 A | | 7/1996 | Fujiu et al. |
| 5,673,220 A | | 9/1997 | Gendlin |
| 2002/0017836 A1 | | 2/2002 | Chu |

FOREIGN PATENT DOCUMENTS

| | | |
|---|---|---|
| GB | 1 382 326 | 3/1972 |
| GB | 2 284 298 A | 5/1995 |
| GB | 2 329 514 A | 3/1999 |
| GB | 2 362 989 | 12/2001 |
| JP | 4038866 | 2/1992 |
| JP | A-4-38866 | 2/1992 |
| JP | 11017126 | 1/1999 |
| WO | WO 92/06509 A1 | 4/1992 |
| WO | WO 99/42282 A1 | 8/1999 |

OTHER PUBLICATIONS

U.S. Appl. No. 09/866,740, filed May 30, 2001, Chu.

* cited by examiner

*Primary Examiner*—Shouxiang Hu
(74) *Attorney, Agent, or Firm*—Oliff & Berridge, PLC

(57) ABSTRACT

A memory device comprising a layer of piezoelectric material and a layer of ferroelectric material clamped together such that a voltage applied to one layer results in a voltage being generated across the other layer. The method of data storage and retrieval comprising the steps of: providing a layer of ferroelectric material, providing a layer of piezoelectric material, clamping the two layers together, storing data by internally polarising the ferroelectric material in one of two stable directions in accordance with the data to be stored, and retrieving stored data by applying a non-polarising voltage to one layer and detecting a resultant voltage from the other layer. Preferably, the piezoelectric material is implemented as a ferroelectric material.

15 Claims, 2 Drawing Sheets

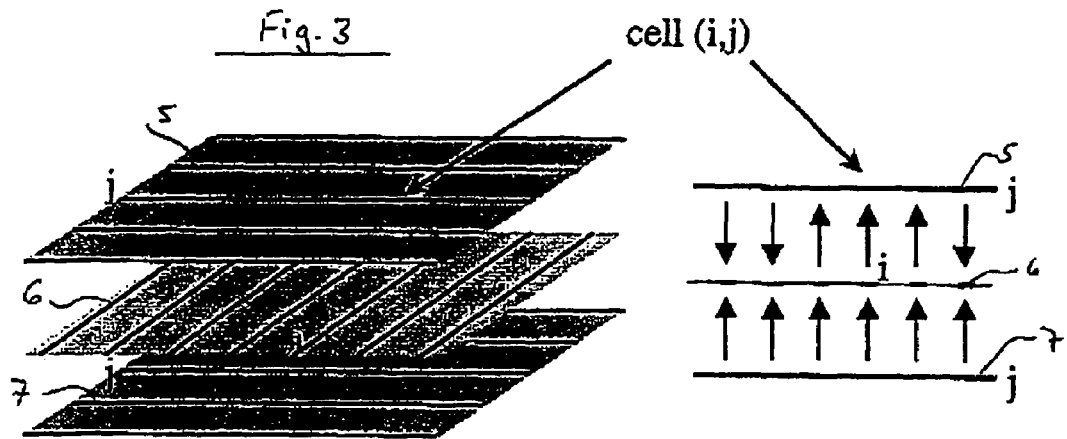
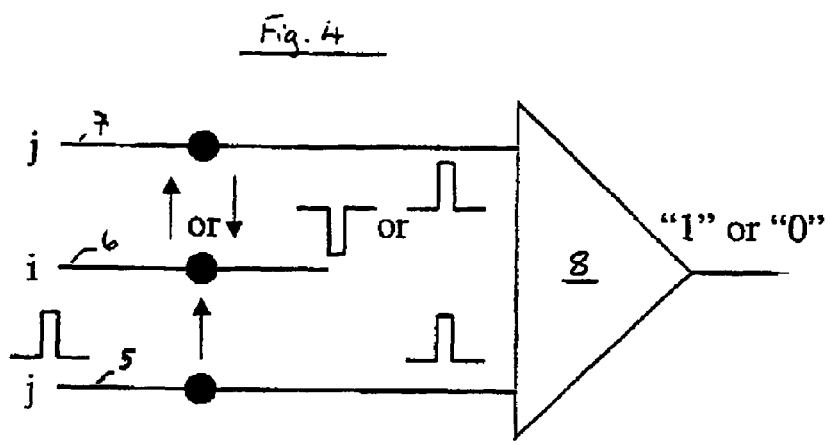
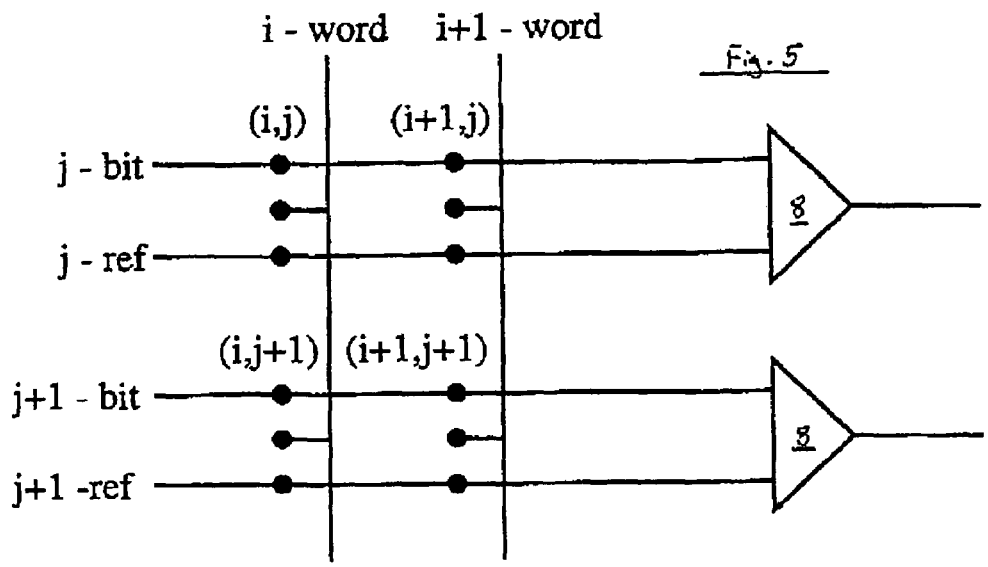

MEMORY DEVICE

The present invention relates to a memory device for data storage and in particular the invention relates to a memory device which makes use of the piezoelectric effect Ferroelectric materials, as a sub-set of piezoelectric materials, can exhibit a nonvolatile, bi-stable internal polarisation. The state of polarisation is established by the application of a voltage between opposing surfaces of the material. Having applied a sufficiently large voltage to internally polarise the material, it ought subsequently to be possible to deter the direction of polarisation—which can be used as a binary indicator, whereby the material can act as a data storage medium. However, a problem arises in that the data read operation is destructive of the data. Specifically, the read operation would consist of applying a voltage to set the polarisation in a specified direction. If the polarisation is already in that direction no charge exchange is required. However, if he polarisation is in the opposite direction a relatively large amount of charge exchange is required to establish the specified direction of polarisation. Thus, the previous direction of polarisation can be judged according to the high or low (zero) level of charge exchange required to establish the specified polarisation.

It is an object of the present invention to provide a memory device which makes use of the internal polarisation of a ferroelectric material for data storage and in which a non-destructive data read operation can be undertaken. It is another object of the present invention to provide a method of data storage and retrieval which makes use of the internal polarisation of a ferroelectric material and in which a non-destructive data read operation can be undertaken.

According to a first aspect of the present invention there is provided a memory device comprising a layer of piezoelectric material and a layer of ferroelectric material clamped together such that a voltage applied to one layer results in a voltage being generated across the other layer. Preferably, the piezoelectric material is implemented as a ferroelectric material.

According to a second aspect of the present invention there is provided a method of data storage and retrieval comprising the steps of; providing a layer of ferroelectric material, providing a layer of piezoelectric material, clamping the two layers together, storing data by internally polarising the ferroelectric material in one of two stable directions in accordance with the data to be stored, and retrieving stored data by applying a non-polarising voltage to one layer and detecting a resultant voltage from the other layer. Preferably, the step of providing a layer of piezoelectric material comprises the step of providing a ferroelectric material as that piezoelectric material.

Embodiments of the present invention will now be described in more detail, by way of further example only and with reference to the accompanying drawings, in which:

FIG. 3 is a diagrammatic representation of a multi-cell memory device according to another embodiment of the present invention;

FIG. 4 illustrates a data read operation for a single cell memory device; and

FIG. 5 illustrates the application of a conventional addressing scheme to a matrix memory device according to the present invention.

Figure 1:
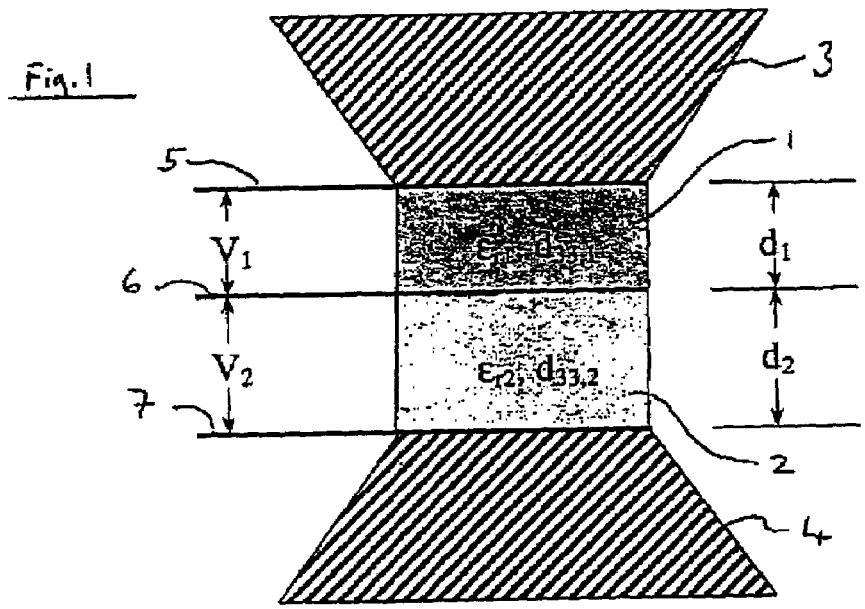
FIG. 1 illustrates the principle of operation of a piezoelectric device which acts as a voltage amplifier.

A description of the principle of operation of a piezoelectric device acting as a voltage amplifier will now be given, with reference to FIG. 1, As illustrated in FIG. 1, two layers (1, 2) of piezoelectric material are confined between two clamping members (3, 4). The voltage associated with the first layer (1) of piezoelectric material is referenced as $V_1$, it's thickness as $d_1$ and its inherent characteristics as $\epsilon_{r1}$ and $d_{33,1}$. Similarly, the voltage associated with the second layer (2) of piezoelectric material is referenced as $V_2$, it's thickness as $d_2$ and its inherent characteristics as $\epsilon_{r2}$ and $d_{33,2}$. Ideally, $$\Delta d_i(E_i) \equiv d_i(E_i) - d_i(O) \approx d_{33,i} d_i(O) E_i \approx d_{33,i} V_i$$

Due to the external confinement of the layers, $\Sigma \Delta d_i = 0$ and hence:

$$V_2 = \pm (d_{33,1}/d_{33,2}) V_1$$

where the signs correspond to the parallel and anti-parallel polarisation between layers 1 and 2.

The device illustrated in FIG. 1 may be referred to as a ferroelectric amplifier, ferroelectric and piezoelectric effects being considered to coexist.

As already noted, a relatively large voltage is required to change the direction of polarisation of the ferroelectric materials. Applying a relatively small voltage will not change the direction of polarisation. Thus, in the device illustrated in FIG. 1 applying a small voltage $V_1$ will not change the polarisation of layer 1 but by reading the sign of the consequential output $V_2$ (the magnitude of which is sufficiently small so as not to change the direction of polarisation of layer 2) the parallel or anti-parallel polarisation directions of layers 1 and 2 is immediately, and non-destructively, detected. Thus, considering the polarisation direction of one of the layers as a reference and arranging for the polarisation direction of the other layer to be hanged to represent a binary indicator, a non-volatile memory device is provided in which non-destructive reading of he binary indicator is performed simply by phase comparison of the input and output read voltages. An example of the thus described basic cell is illustrated in FIG. 2.

Figure 2:
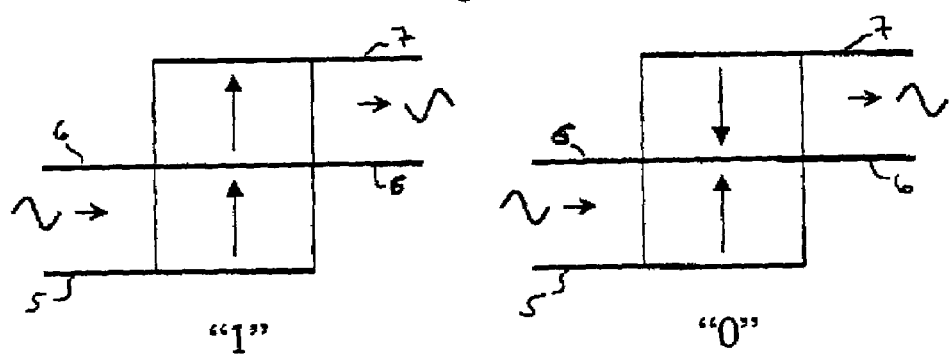
FIG. 2 is a diagrammatic representation of data storage modes in a memory device according to one embodiment of the present invention.

In FIG. 2, the polarisation of the lower layer is used as the reference and the polarisation of the upper layer is used for data storage. As illustrated, the parallel polarisation condition has been associated with binary "1", input and output voltages being out of phase, and the anti-parallel polarisation condition is associated with binary "0", input and output voltages being in phase.

A particular advantage of the memory device according to the present invention is that it is not easily affected by external disturbance. The displacement involved in the read out is internal and relative. It can be considered analogous to the optical mode of phonons. External disturbance, eg vibrations, is similar to the acoustic mode and has very little impact on the output.

From the foregoing description it will be appreciated that one aspect of the present invention resides in the use of the piezoelectric effect to read data from a memory cell. Specifically, the so-called reference layer of FIG. 2 can be implemented as a piezoelectric layer rather than a ferroelectric layer. Applying a voltage to the piezoelectric layer causes a contraction or expansion of the piezoelectric layer and a resulting change in the ferroelectric layer, which change is detectably dependent upon the direction of polarisation of the ferroelectric material. This can be considered as an in-phase only version of the embodiment of FIG. 2. Further, although clamping of the layers has been illustrated in terms of a physical confinement (constant distance), clamping of the layers is also to be understood as subjecting them to a constant force (stress)—for example. The requirement is that the change in one layer should act upon the other layer and not be lost externally.

The operation of a single memory cell has been described with reference to FIGS. 1 and 2. For practical use it is desirable to provide an array of many cells. Such an array can readily be provided in accordance with the present invention. The basic cell requires three electrodes. These are identified by reference numerals 5, 6 and 7 in FIG. 1. That is, voltage $V_1$ is applied between electrodes 5 and 6 and voltage $V_2$ is measured between electrodes 6 and 7. Although a common electrode 6 is illustrated, it would of course be feasible to use two respective separate electrodes, for the upper and lower layers, in place thereof. As shown in FIG. 3, an array of cells is formed by providing a respective plurality of electrodes 5, 6 and 7. A plurality of elongate, parallel and spaced apart electrodes 5 are provided in one plane. A similar plurality of elongate, parallel and spaced apart electrodes 7 are provided in a parallel plane and a plurality of elongate, parallel and spaced apart electrodes 6 are provided in another parallel plane, between the other two planes. Further, the electrodes 5 and 7 are parallel to each other and vertically aligned whereas the electrodes 6 are perpendicular to electrodes 5 and 7. Individual memory cells are thus formed at each point of "intersection" or overlap of respective individual electrodes 5, 6 and 7.

As illustrated in FIG. 4, a comparator 8 is used to read each memory cell. Comparator 8 compares the sign, or phase, of the voltages $V_1$ and $V_2$ and the output can be taken directly as the binary value "1" or "0". It is a particular advantage of the present invention that the data content of the memory cell can be read using a simple comparator circuit.

The memory array explained with reference to FIG. 3, using a plurality of comparators as described with reference to FIG. 4, can be used to implement either an active or a passive matrix. Importantly, the resulting matrix can be addressed using conventional addressing techniques, The matrix connections for conventional addressing of a plurality of memory cells according to the present invention is depicted in FIG. 5.

The aforegoing description has been given by way of example only and it will be appreciated by a person skilled in the art that modifications can be made without departing from the scope of the present invention.

The invention claimed is:

1. A memory device comprising:
   a plurality of first electrodes;
   a plurality of second electrodes;
   a plurality of third electrodes; and
   a two-dimensional array of memory cells provided corresponding to intersections between the plurality of first electrodes and the plurality of second electrodes and to intersections between the plurality of second electrodes and the plurality of third electrodes; wherein
   each of the memory cells includes a first layer that includes a piezoelectrie material and a second layer including a ferroelectric material,
   one second electrode of the plurality of the second electrodes is provided between the first layer and the second layer, and
   the first layer and the second layer are provided between one first electrode of the plurality of first electrodes and one third electrode of the plurality of third electrodes;
   the memory device further comprising:
   a plurality of comparators, each of which is provided corresponding to a pair of one first electrode of the plurality of first electrodes and one third electrode of the plurality of third electrodes, one comparator being thereby provided for each row of the memory cells, each of the comparators having a first input and a second input that are directly connected to the one first electrode and the one third electrode, respectively.

2. A memory device as claimed in claim 1, wherein the piezoelectric material is a ferroelectric material.

3. A memory device as claimed in claim 1, the plurality of first electrodes being arranged parallel to each other in a spaced apart manner in a first plane,
   the plurality of second electrodes being arranged parallel to each other in a spaced apart manner in a second plane, and
   the plurality of third electrodes being arranged parallel to each other in a spaced apart manner in a third plane,
   the first plane, the second plane and the third plane being parallel to each other, and
   the plurality of first electrodes and the plurality of third electrodes being perpendicular to the plurality of second electrodes.

4. A memory device as claimed in claim 1, the one comparator comparing a first voltage between the one first electrode and the one second electrode with a second voltage between the one third electrode and the one second electrode.

5. A memory device as claimed in claim 4,
   the plurality of first electrodes being arranged parallel to each other in a spaced apart manner in a first plane,
   the plurality of second electrodes being arranged parallel to each other in a spaced apart manner in a second plane, and
   the plurality of third electrodes being arranged parallel to each other in a spaced apart manner in a third plane,
   the first plane, the second plane and the third plane being parallel to each other, and
   the plurality of first electrodes and the plurality of third electrodes being perpendicular to the plurality of second electrodes.

6. A memory device comprising:
   a plurality of first electrodes;
   a plurality of second electrodes that intersect the plurality of first electrodes;
   a plurality of third electrodes that intersect the plurality of second electrodes;
   a plurality of memory cells that include a plurality of first layers, each of which includes a piezoelectric material, and a plurality of second layers, each of which includes a ferroelectric material; and
   a plurality of comparators, each of which is provided corresponding to a pair of one first electrode of the plurality of first electrodes and one of the plurality of third electrodes, one comparator being thereby provided for each row of the memory cells, each of the plurality of comparators having a first input and a second input that are directly connected to the one first electrode and the one third electrode, respectively;
   one first layer of the plurality of first layers being provided between the one first electrode and one second electrode of the plurality of second electrodes, and
   one second layer of the plurality of second layers being provided between the one second electrode and the one third electrode.

7. A memory device as claimed in claim 6, the plurality of first electrodes being arranged parallel to each other in a spaced apart manner in a first plane, the plurality of second electrodes being arranged parallel to each other in a spaced apart manner in a second plane, and the plurality of third electrodes being arranged parallel to each other in a spaced apart manner in a third plane, the first plane, the second plane and the third plane being parallel to each other, and the plurality of first electrodes and the plurality of the third electrodes being perpendicular to the plurality of second electrodes.

8. The memory device as claimed in claim 6, one memory cell of the plurality of memory cells being provided between the one first electrode and the one third electrode.

9. A memory device as claimed in claim 8, the plurality of first electrodes being arranged parallel to each other in a spaced apart manner in a first plane, the plurality of second electrodes being arranged parallel to each other in a spaced apart manner in a second plane, and the plurality of third electrodes being arranged parallel to each other in a spaced apart manner in a third plane, the first plane, the second plane and the third plane being parallel to each other, and the plurality of first and the plurality of third electrodes being perpendicular to the plurality of second electrodes.

10. The memory device as claimed in claim 6, each of the plurality of comparators being arranged for one of the plurality of pairs of the plurality of first electrodes and the plurality of third electrodes.

11. A memory device as claimed in claim 10, the plurality of first electrodes being arranged parallel to each other in a spaced apart manner in a first plane, the plurality of second electrodes being arranged parallel to each other in a spaced apart manner in a second plane, and the plurality of third electrodes being arranged parallel to each other in a spaced apart manner in a third plane, the first plane, the second plane and the third plane being parallel to each other, and the plurality of first electrodes and the plurality of the third electrodes being perpendicular to the plurality of second electrodes.

12. The memory device as claimed in claim 6, each of the plurality of comparators having a first input that is coupled to one first electrode of one pair of the plurality of first electrodes and the plurality of third electrodes and a second input that is coupled to the one third electrode of the one pair.

13. The memory device as claimed in claim 12, one of the plurality of comparators comparing a first voltage between the one first electrode and the one second electrode with a second voltage between the one third electrode and the one second electrode.

14. The memory device as claimed in claim 13, the plurality of first electrodes being arranged parallel to each other in a spaced apart manner in a first plane, the plurality of second electrodes being arranged parallel to each other in a spaced apart manner in a second plane, and the plurality of third electrodes being arranged parallel to each other in a spaced apart manner in a third plane, the first plane, the second plane and the third plane being parallel to each other, and the plurality of first electrodes and the plurality of the third electrodes being perpendicular to the plurality of second electrodes.

15. The memory device as claimed in claim 12, the plurality of first electrodes being arranged parallel to each other in a spaced apart manner in a first plane, the plurality of second electrodes being arranged parallel to each other in a spaced apart manner in a second plane, and the plurality of third electrodes being arranged parallel to each other in a spaced apart manner in a third plane, the first plane, the second plane and the third plane being parallel to each other, and the plurality of first electrodes and the plurality of the third electrodes being perpendicular to the plurality of second electrodes.

* * * * *